United States Patent
Liu

(10) Patent No.: US 11,240,910 B2
(45) Date of Patent: Feb. 1, 2022

(54) HEAT DISSIPATION STRUCTURE AND ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cheng-Xiang Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/916,059

(22) Filed: Jun. 29, 2020

(65) Prior Publication Data

US 2021/0337659 A1    Oct. 28, 2021

(30) Foreign Application Priority Data

Apr. 27, 2020   (CN) .......................... 202010345797.4

(51) Int. Cl.
 *H05K 7/20*  (2006.01)
 *H05K 1/02*  (2006.01)

(52) U.S. Cl.
 CPC ....... *H05K 1/0272* (2013.01); *H05K 7/20272* (2013.01); *H05K 7/20281* (2013.01); *H05K 2201/064* (2013.01)

(58) Field of Classification Search
 CPC ............. H05K 1/0272; H05K 7/20272; H05K 7/20281; H05K 2201/064

USPC .......................................... 361/699; 174/252
 See application file for complete search history.

(56) References Cited

U.S. PATENT DOCUMENTS

| | | | | |
|---|---|---|---|---|
| 4,652,970 A | * | 3/1987 | Watari | H01L 23/055 165/80.4 |
| 4,704,658 A | * | 11/1987 | Yokouchi | H05K 7/203 165/104.33 |
| 4,724,611 A | * | 2/1988 | Hagihara | H01L 21/50 257/E21.499 |
| 4,739,443 A | * | 4/1988 | Singhdeo | H01L 23/15 361/689 |
| 5,006,924 A | * | 4/1991 | Frankeny | H01L 23/42 165/46 |
| 5,224,017 A | * | 6/1993 | Martin | H01L 23/3733 165/185 |
| 5,305,184 A | * | 4/1994 | Andresen | H01L 23/44 165/104.33 |
| 5,380,956 A | * | 1/1995 | Loo | H01L 23/473 174/252 |
| 5,448,108 A | * | 9/1995 | Quon | H01L 23/473 257/714 |

(Continued)

*Primary Examiner* — Anatoly Vortman
(74) *Attorney, Agent, or Firm* — ScienBiziP, P.C.

(57) ABSTRACT

A heat dissipation structure applied to an electronic device includes a circuit board assembly, a pipe, a refrigerant fluid, and a water pump. The circuit board assembly is provided with a receiving chamber therein, an inlet, and an outlet. Each of the inlet and the outlet communicates with the receiving chamber. The pipe and the receiving chamber together form a liquid channel. The refrigerant fluid is received in the liquid channel. The water pump communicates with the pipe and is configured to circulate the refrigerant fluid in the liquid channel to remove heat from the circuit board assembly.

13 Claims, 4 Drawing Sheets

(56) References Cited

U.S. PATENT DOCUMENTS

| | | | | |
|---|---|---|---|---|
| 5,763,950 A * | 6/1998 | Fujisaki | H01L 23/3672 | 165/80.3 |
| 5,920,458 A * | 7/1999 | Azar | H01L 23/3677 | 361/704 |
| 5,978,220 A * | 11/1999 | Frey | H01L 23/473 | 361/699 |
| 6,052,284 A * | 4/2000 | Suga | H01L 23/473 | 361/699 |
| 6,055,154 A * | 4/2000 | Azar | H01L 23/473 | 165/104.33 |
| 6,154,369 A * | 11/2000 | Martinez, Jr. | H01L 23/24 | 361/719 |
| 6,256,201 B1 * | 7/2001 | Ikeda | F28D 15/0233 | 165/104.26 |
| 6,473,303 B2 * | 10/2002 | Kaufmann | H01L 21/4882 | 165/80.4 |
| 6,717,812 B1 * | 4/2004 | Pinjala | H01L 23/473 | 165/80.4 |
| 6,882,156 B2 * | 4/2005 | Hauptman | G01R 31/31905 | 324/512 |
| 6,992,887 B2 * | 1/2006 | Jairazbhoy | H01L 23/473 | 165/80.4 |
| 6,999,316 B2 * | 2/2006 | Hamman | F28D 1/0535 | 165/104.31 |
| 7,254,030 B2 * | 8/2007 | Chiba | H01L 23/473 | 361/710 |
| 7,272,015 B2 * | 9/2007 | Karrer | B60R 16/0239 | 174/15.1 |
| 7,471,515 B2 * | 12/2008 | Chang | H01L 23/473 | 165/104.33 |
| 8,363,402 B2 * | 1/2013 | Brunschwiler | H01L 23/473 | 361/699 |
| 9,812,377 B2 * | 11/2017 | Yamada | H01L 25/072 | |
| 10,383,251 B1 * | 8/2019 | Liu | H05K 5/0017 | |
| 10,939,554 B1 * | 3/2021 | Liu | H05K 1/181 | |
| 2003/0151883 A1 * | 8/2003 | Hauptman | G01R 31/31905 | 361/514 |
| 2004/0188132 A1 * | 9/2004 | Borrego Bel | H05K 1/0272 | 174/252 |
| 2005/0083652 A1 * | 4/2005 | Jairazbhoy | H01L 23/473 | 361/689 |
| 2010/0231250 A1 * | 9/2010 | Breinlinger | G01R 31/2889 | 324/750.08 |
| 2010/0328882 A1 * | 12/2010 | Campbell | H01L 23/427 | 361/689 |
| 2013/0139998 A1 * | 6/2013 | Hayashi | H05K 7/20236 | 165/47 |
| 2014/0015119 A1 * | 1/2014 | Bonkohara | H01L 25/0657 | 257/713 |
| 2014/0321053 A1 * | 10/2014 | Donnelly | F28C 3/06 | 361/691 |
| 2014/0345914 A1 * | 11/2014 | Meyer | B32B 9/005 | 174/252 |
| 2014/0355212 A1 * | 12/2014 | Campbell | H05K 7/20236 | 361/699 |

\* cited by examiner

HEAT DISSIPATION STRUCTURE AND ELECTRONIC DEVICE

FIELD

The subject matter herein generally relates to electronic devices, more particularly to a heat dissipation structure applied to an electronic device, and an electronic device using the heat dissipation structure.

BACKGROUND

More and more components being integrated into an electronic device means that heat dissipation from the electronic device becomes more important. In the related art, in order to transmit heat energy out of the electronic device, one solution is to use a heat conducting element (such as a locating screw) to contact the heat source (such as a circuit board) and the housing. However, this manner of heat dissipation is dependent on the temperature of the external environment, and the heat dissipation efficiency may be low.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
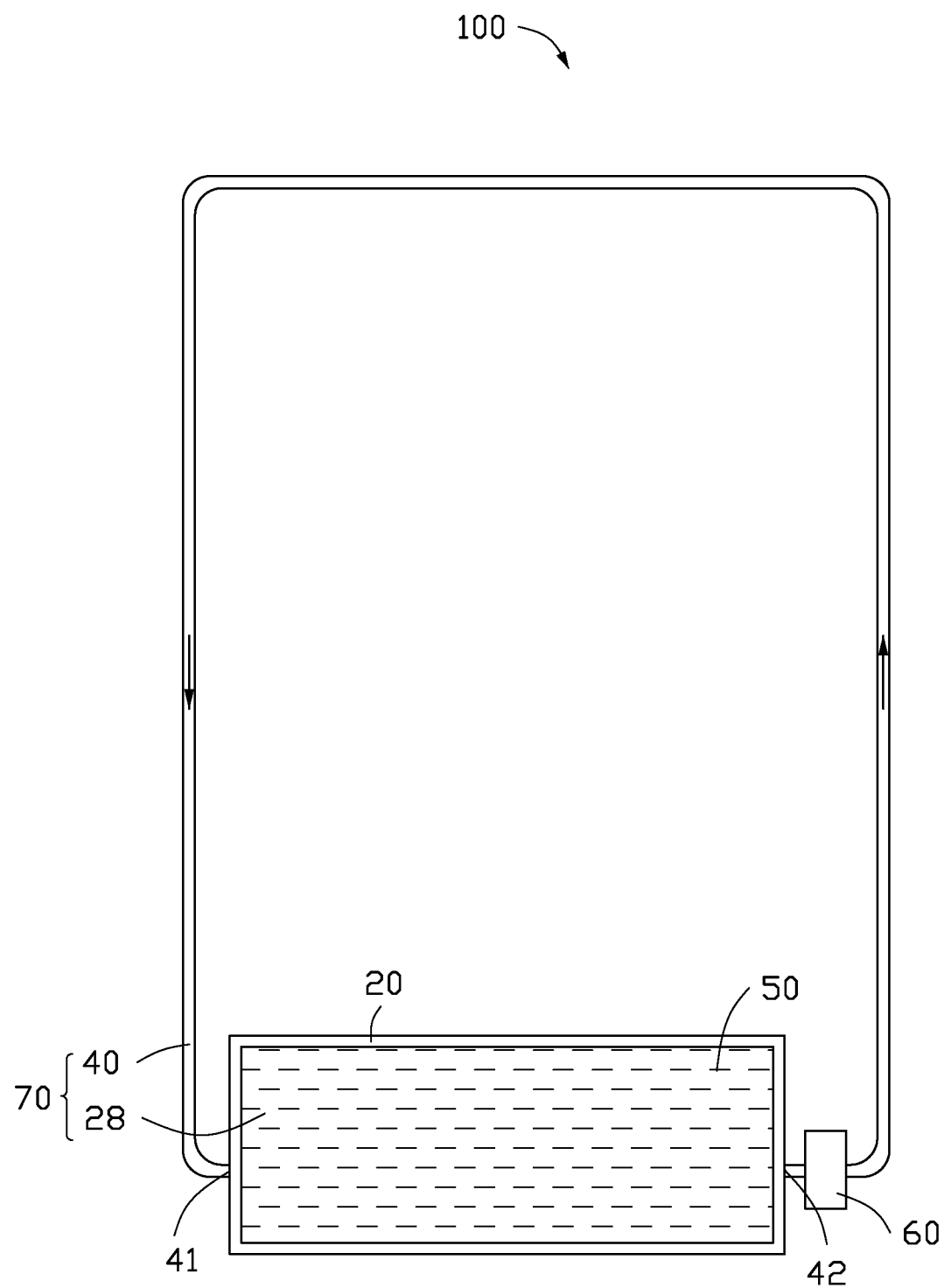
FIG. 1 is a schematic structural view of a heat dissipation structure in one embodiment.

FIG. 1 illustrates a heat dissipation structure 100 of an exemplary embodiment of the present disclosure. The heat dissipation structure 100 is applied to an electronic device. The heat dissipation structure 100 includes a circuit board assembly 20, a pipe 40, a refrigerant fluid 50, and a water pump 60. The pipe 40 communicates with the circuit board assembly 20 and the water pump 60 to form a closed loop. The water pump 60 is configured to circulate the refrigerant fluid 50 in the closed loop.

Figure 2:
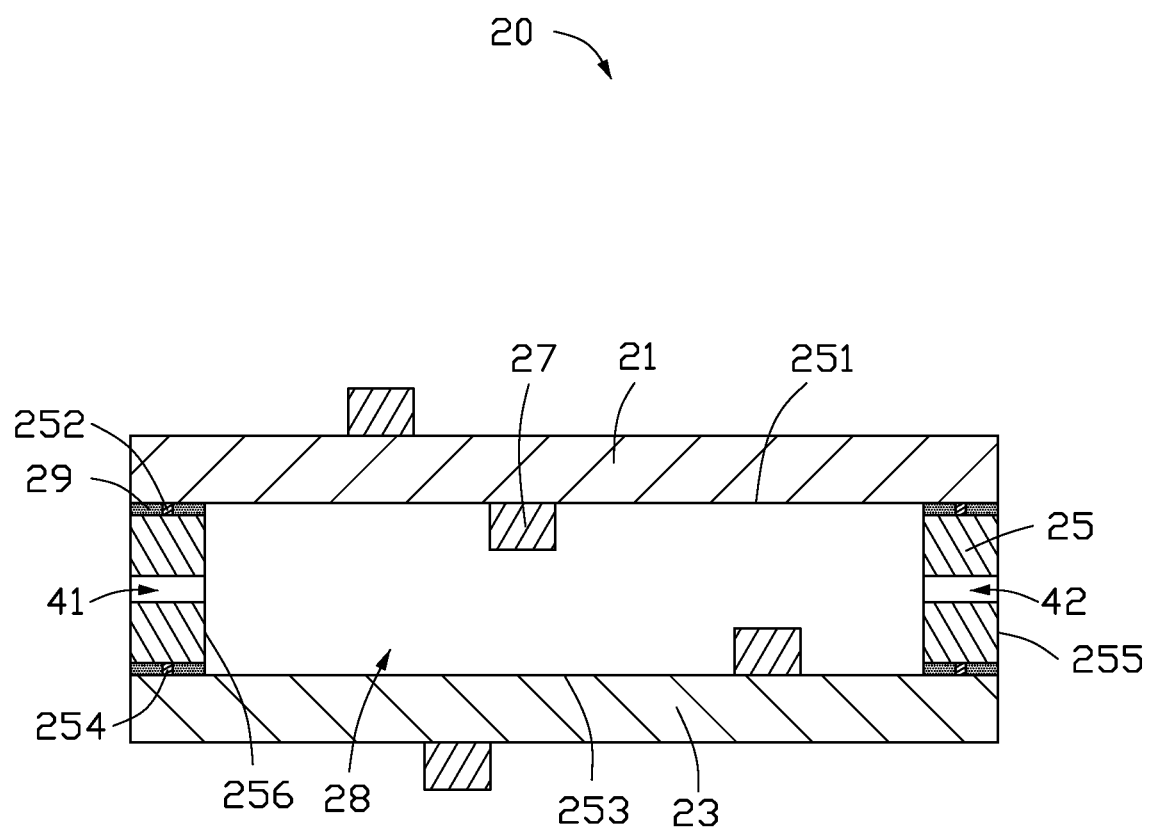
FIG. 2 is a cross-sectional view of a circuit board assembly of the heat dissipation structure of FIG. 1.

FIG. 2 illustrates that the circuit board assembly 20 includes a first circuit board 21, a second circuit board 23, an interposer 25, and at least one electronic component 27. The interposer 25 is sandwiched between the first circuit board 21 and the second circuit board 23, and electrically connects the first circuit board 21 and the second circuit board 23. In the embodiment, the first circuit board 21 and the second circuit board 23 are both printed circuit boards.

The interposer 25 includes a first surface 251, a second surface 253 opposite to the first surface 251, and a lateral surface 255 connecting the first surface 251 and the second surface 253. The first surface 251 is in contact with the first circuit board 21, and the second surface 253 is in contact with the second circuit board 23. The first surface 251 is provided with a plurality of first solder pads 252, the second surface 253 is provided with a plurality of second solder pads 254. The first circuit board 21 is soldered to the interposer 25 through the first solder pads 252, and the second circuit board 23 is soldered to the interposer 25 through the second solder pads 254. That is, each of the first circuit board 21 and the second circuit board 23 is soldered to the interposer 25. In the embodiment, the first solder pads 252 partly protrude from the first surface 251, and the second solder pads 254 partly protrude from the second surface 253. In an alternative embodiment, the first solder pads 252 may wholly protrude from the first surface 251 or be embedded into the interposer 25, and the second solder pads 254 may wholly protrude from the second surface 253 or be embedded into the interposer 25. The interposer 25 defines a through hole 256 passing through the first surface 251 and the second surface 253. The first circuit board 21 and the second circuit board 23 cover the ends of the through hole 256 to form a receiving chamber 28.

The heat dissipation structure 100 further includes an adhesive 29. The adhesive 29 infills the small gaps between the contact surfaces of the interposer 25 and the first circuit board 21, and between the contact surfaces of the interposer 25 and the second circuit board 23. That is, the adhesive 29 is between the first surface 251 and the surface of the first circuit board 21 in contact with the interposer 25, and the adhesive 29 is between the second surface 253 and the surface of the second circuit board 23 in contact with the interposer 25. The adhesive 29 seals the receiving chamber 28.

The electronic component 27 may be disposed on at least one of the first circuit board 21 and the second circuit board 23 and received in the receiving chamber 28. The electronic component 27 may be a resistor, a capacitor, a diode, a transistor, or the like. The electronic component 27 being received in the receiving chamber 28 allows a size of the circuit board assembly 20 to be reduced.

The interposer 25 further defines an inlet 41 and an outlet 42 communicating with the receiving chamber 28. Each of the inlet 41 and the outlet 42 passes through the lateral surface 255 of the interposer 25.

Referring to FIG. 1, the pipe 40 is arranged outside of the circuit board assembly 20, and communicates with the inlet 41 and the outlet 42. The pipe 40 and the receiving chamber 28 together form a liquid channel 70. The pipe 40 may be a tube of metal, so as to facilitate heat dissipation. The heat dissipation structure 100 further includes sealing elements (not shown). One sealing element is disposed between the inlet 41 and the pipe 40, and another sealing element is disposed between the outlet 42 and the pipe 40, allowing effective sealing of the receiving chamber 28.

The refrigerant fluid 50 is received in the liquid channel 70, and configured to transfer the heat generated by the circuit board assembly 20 to the pipe 40. The refrigerant fluid 50 is electrically non-conductive, and may include purified water, ethylene glycol, or the like. In an alternative embodiment, the boiling point of the refrigerant fluid 50 is greater than 150° C.

The water pump 60 communicates with the pipe 40 and is used to circulate the refrigerant fluid 50 in the liquid channel 70. In this embodiment, the water pump 60 is a microscale pump, such as an electrostatic pump, a piezoelectric pump, an electromagnetic pump, or the like.

Figure 3:
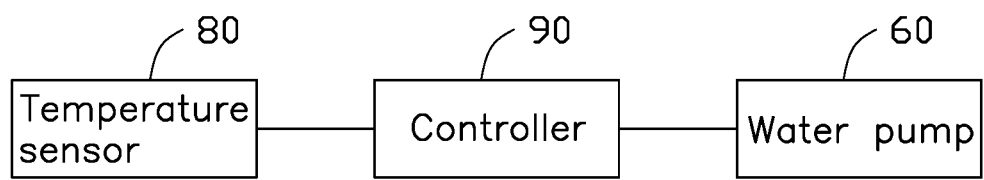
FIG. 3 is a block diagram of the heat dissipation structure in one embodiment.

FIG. 3 illustrates that the heat dissipation structure 100 further includes a temperature sensor 80 and a controller 90. The temperature sensor 80 is configured to detect the temperature of the circuit board assembly 20 and send it to the controller 90. The controller 90 controls the water pump 60 to turn on/off according to the comparison between the detected temperature and the preset temperature. The preset temperature may be the threshold temperature of the electronic component 27. The temperature sensor 80 is disposed on the first circuit board 21 or the second circuit board 23, and may be located inside or outside of the receiving chamber 28.

When the temperature of the circuit board assembly 20 is more than the preset temperature, the controller 90 controls the water pump 60 to turn on, and the water pump 60 drives the refrigerant fluid 50 to circulate in the liquid channel 70, so lowering the temperature of the circuit board assembly 20. After the refrigerant fluid 50 in the circuit board assembly 20 absorbs some heat of the circuit board assembly 20, it flows out from the outlet 42, and after losing the heat through the pipe 40, it flows back from the inlet 41 into the receiving chamber 28 to continue and complete the heat-absorbing and dissipating cycle. When the temperature of the circuit board assembly 20 is less than the preset temperature, the controller 90 controls the water pump 60 to turn off.

Figure 4:
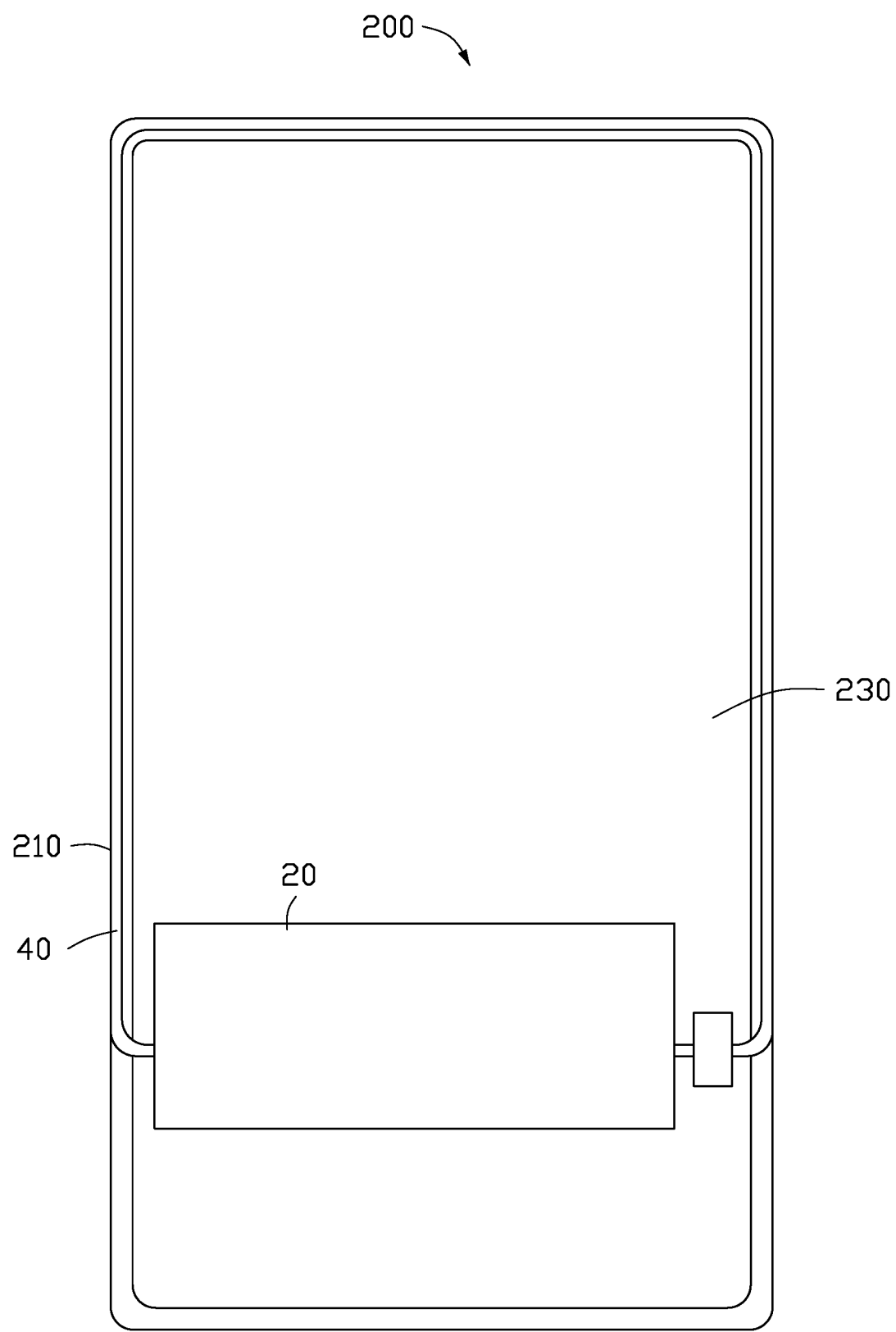
FIG. 4 is a schematic structural view of an electronic device in one embodiment.

FIG. 4 illustrates an electronic device 200 in one embodiment of the present disclosure. The electronic device 200 includes a housing and the heat dissipation structure 100. The heat dissipation structure 100 is received in the housing. The pipe 40 is in contact with the housing, it is the housing which finally transfers the heat of the circuit board assembly 20 to the outside of the electronic device 200. The housing includes a bottom cover (not shown) and a metal frame 210. The metal frame 210 is disposed around the periphery of the bottom cover. The metal frame 210 and the bottom cover together form a receiving chamber 230 for receiving the heat dissipation structure 100. The pipe 40 is disposed around the metal frame 210 and in contact with the metal frame 210 to increase the contact area between the pipe 40 and the housing, thereby improving the heat dissipation efficiency. The electronic device 200 may be a mobile terminal, such as a mobile phone, a tablet computer, or a wearable device; it may also be other electronic devices, such as a digital camera, an e-book, or a navigator device.

In the heat dissipation structure 100 and the electronic device 200, the heat generated by the circuit board assembly 20 can be quickly transferred to the pipe 40 by the refrigerant fluid 50, such that the heat dissipation efficiency is improved. When the temperature of the circuit board assembly 20 is more than the preset temperature, the controller 90 controls the water pump 60 to turn on, and the water pump 60 drives the refrigerant fluid 50 to circulate, such that the heat dissipation efficiency is further improved.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A heat dissipation structure, applied to an electronic device, comprising:
a circuit board assembly provided with a receiving chamber therein, an inlet, and an outlet, each of the inlet and the outlet communicating with the receiving chamber, wherein the circuit board assembly comprises a first circuit board, a second circuit board, and an interposer sandwiched between the first circuit board and the second circuit board, the interposer defines a through hole, and the first circuit board and the second circuit board cover ends of the through hole to form the receiving chamber, the interposer comprises a first surface in contact with the first circuit board and a second surface in contact with the second circuit board, the first surface is provided with a plurality of first solder pads, the second surface is provided with a plurality of second solder pads, the first circuit board is soldered to the plurality of first solder pads to electrically connect to the interposer, the second circuit board is soldered to the plurality of second solder pads to electrically connect to the interposer;
a pipe communicating with the inlet and the outlet, the pipe and the receiving chamber together forming a liquid channel;
a refrigerant fluid received in the liquid channel; and
a water pump communicating with the pipe and configured to circulate the refrigerant fluid in the liquid channel.

2. The heat dissipation structure of claim 1, further comprising a temperature sensor and a controller, wherein the temperature sensor is configured to detect a temperature of the circuit board assembly and send it to the controller, the controller controls the water pump to turn on/off according to a comparison between the detected temperature and a preset temperature.

3. The heat dissipation structure of claim 1, wherein the pipe is a tube of metal.

4. The heat dissipation structure of claim 1, further comprising an adhesive, wherein the adhesive infills gaps between contact surfaces of the first circuit board and the interposer, and between contact surfaces of the interposer and the second circuit board.

5. The heat dissipation structure of claim 1, further comprising at least one electronic component, wherein the at least one electronic component is disposed on at least one of the first circuit board and the second circuit board, and received in the receiving chamber.

6. The heat dissipation structure of claim 1, wherein the refrigerant fluid is electrically non-conductive and has a boiling point more than 150° C.

7. An electronic device comprising:
a housing; and
a heat dissipation structure received in the housing and in contact with the housing, the heat dissipation structure comprising:
a circuit board assembly provided with a receiving chamber therein, an inlet, and an outlet, each of the inlet and the outlet communicating with the receiving chamber, wherein the circuit board assembly comprises a first circuit board, a second circuit board, and an interposer sandwiched between the first circuit board and the second circuit board, the interposer defines a through hole, and the first circuit board and the second circuit board cover ends of the through hole to form the receiving chamber, the interposer comprises a first surface in contact with the first circuit board and a second surface in contact with the second circuit board, the first surface is provided with a plurality of first solder pads, the second surface is provided with a plurality of second solder pads, the first circuit board is soldered to the plurality of first solder pads to electrically connect to the interposer, the second circuit board is soldered to the plurality of second solder pads to electrically connect to the interposer, a pipe communicating with the inlet and the outlet, the pipe and the receiving chamber together forming a liquid channel, a refrigerant fluid received in the liquid channel, and a water pump communicating with the pipe and configured to circulate the refrigerant fluid in the liquid channel.

8. The electronic device of claim 7, wherein the housing comprises a metal frame, the pipe is arranged around the metal frame.

9. The electronic device of claim 7, wherein the heat dissipation structure further comprises a temperature sensor and a controller, the temperature sensor is configured to detect a temperature of the circuit board assembly and send it to the controller, the controller controls the water pump to turn on/off according to a comparison between the detected temperature and a preset temperature.

10. The electronic device of claim 7, wherein the pipe is a tube of metal.

11. The electronic device of claim 7, wherein the heat dissipation structure further comprises an adhesive, the adhesive infills gaps between contact surfaces of the first circuit board and the interposer, and between contact surfaces of the interposer and the second circuit board.

12. The electronic device of claim 7, wherein the heat dissipation structure further comprises at least one electronic component, the at least one electronic component is disposed on at least one of the first circuit board and the second circuit board, and received in the receiving chamber.

13. The electronic device of claim 7, wherein the refrigerant fluid is electrically non-conductive and has a boiling point more than 150° C.

* * * * *